United States Patent
Jenkins

(10) Patent No.: US 6,489,811 B2
(45) Date of Patent: Dec. 3, 2002

(54) LOGIC GATE WITH SYMMETRICAL PROPAGATION DELAY FROM ANY INPUT TO ANY OUTPUT AND A CONTROLLED OUTPUT PULSE WIDTH

(75) Inventor: Julian L. Jenkins, Santa Cruz, CA (US)

(73) Assignee: Hiband Semiconductor, Inc., Scotts Valley, CA (US)

( * ) Notice: Subject to any disclaimer, the term of this patent is extended or adjusted under 35 U.S.C. 154(b) by 0 days.

(21) Appl. No.: 09/802,700

(22) Filed: Mar. 8, 2001

(65) Prior Publication Data

US 2002/0125915 A1 Sep. 12, 2002

(51) Int. Cl.[7] ............................................. H03K 19/094
(52) U.S. Cl. ......................... 326/115; 326/73; 326/104; 326/108; 326/127
(58) Field of Search ......................... 326/73, 104, 108, 326/115, 127

(56) References Cited

U.S. PATENT DOCUMENTS 4,926,451 A * 5/1990 Yoshihara et al. ............ 326/99
5,107,145 A * 4/1992 Kurashima ................... 326/125
5,122,682 A * 6/1992 Nagasawa .................... 326/115
5,610,539 A * 3/1997 Blauschild et al. .......... 326/127
5,739,703 A * 4/1998 Okamura ..................... 326/110
6,100,716 A * 8/2000 Adham et al. ............... 326/126

FOREIGN PATENT DOCUMENTS

JP 60221324 A * 11/1985 ........... C01G/45/02
JP 02246615 A * 10/1990 ....... H03K/19/0952

* cited by examiner

Primary Examiner—Michael G. Lee
Assistant Examiner—Steven S. Paik
(74) Attorney, Agent, or Firm—Donald R. Boys; Central Coast Patent Agency, Inc.

(57) ABSTRACT

A multilevel logic gate for processing digital data in a semiconductor application is provided. The multilevel logic gate comprises, two or more signal input leads for receiving signal input, two or more signal output leads for outputting signal results and a symmetrical structure of an even number of transistor circuit pairs for combining and amplifying the input signals, the symmetrical structure directly interfacing the input leads. The symmetrical structure causes any input signal to propagate through the structure to output at a same latency as any other input signal to the structure.

12 Claims, 2 Drawing Sheets

LOGIC GATE WITH SYMMETRICAL PROPAGATION DELAY FROM ANY INPUT TO ANY OUTPUT AND A CONTROLLED OUTPUT PULSE WIDTH

FIELD OF THE INVENTION

The present invention is in the field of integrated circuitry as it applies to computerized semiconductor devices and pertains more particularly to methods and apparatus for achieving a symmetric signal propagation delay from input to output in a current mode logic circuit.

BACKGROUND OF THE INVENTION

A logic gate is an elementary building block of a digital circuit. There are several different types of logic gates. The most basic of these are AND, OR, XOR, NOT, NAND, NOR, and XNOR. Generally speaking, a logic gate is defined by a specific truth table that describes required input condition to produce a specific output condition. Most logic gates have multiple inputs and one output. Of course, every terminal in a logic gate assumes a binary condition either 0 or 1 at any given moment in time during operation. These binary conditions are defined by voltage levels applied to the circuit. For example, a low voltage produces a binary 0 and high voltage produces a binary 1. In most logic ICs there is a definitive on and off state and, therefore, a charge storage time to contend with before terminals change state.

A relative recent development in digital logic is known as emitter-coupled-logic (ECL), also known as current-mode-logic (CML). CML is based on the use of a multi-input differential amplifier to amplify and combine the digital signals, and emitter followers to adjust the DC voltage levels. As a result, none of the transistors in the gate ever enter saturation, nor do they ever get turned off completely. The transistors remain entirely within their active operating regions at all times. As a result, the transistors have a much smaller charge storage time to contend with, and can change states much more rapidly. Also the difference between the voltages used to represent the binary values is smaller requiring less charge transfer to change states. Thus, the main advantage of this type of logic gate is extremely high speed.

One issue that one must contend with in a CML multi-input logic gate is that there is an unequal propagation state of individual signal inputs to individual signal outputs through a given array of transistors within a circuit. For example, if one input A/$\overline{A}$ is changed, the latency to the output of the circuit it will experience will be La. If B/$\overline{B}$ is then changed, the latency to output it will experience will be Lb where La≠Lb. This phenomenon is troublesome in various applications such as in phase detection circuits used in phase-locked-loop (PLL) synthesizing. It is well known that a phase detector must quantify phase error of an input signal against a timed reference signal. Latency non-equivalence in propagation from input gates to output of the circuit causes an error in the quantification of phase error.

What is clearly needed is a symmetrical transistor structure within a circuit that equalizes latency within a circuit in terms of signal propagation from multiple inputs to output of the circuit.

SUMMARY OF THE INVENTION

In a preferred embodiment of the present invention, a multilevel logic gate for processing digital data in a semiconductor application is provided. The multilevel logic gate comprises, two or more signal input leads for receiving signal input, two or more signal output leads for outputting signal results and a symmetrical structure of an even number of transistor circuit pairs for combining and amplifying the input signals, the symmetrical structure directly interfacing the input leads. The symmetrical structure causes any input signal to propagate through the structure to output at a same latency as any other input signal to the structure.

In a preferred embodiment, the gate is implemented in current-mode-logic (CML). In one embodiment, the symmetrical structure is an AND structure. In one embodiment, the symmetrical structure is a NAND structure. In one aspect, there are two separate input voltage ranges applied to the gate, the voltage ranges defined as one higher voltage range and one lower voltage range. In this aspect, an even division of the number of signal input leads connected to inputs on the symmetrical structure are operated at the higher voltage range. The remaining number of signal input leads connected to inputs on the symmetrical structure are operated at the lower voltage range.

In another aspect of the present invention, a method for producing an equal signal-propagation latency from any input on multiple input, multilevel logic gate to any output on the gate is provided. The method includes the steps of (a) duplicating the asymmetric structure of the standard logic gate once for each possible combination of inputs, (b) providing each input simultaneously on all input ranges, (c) connecting each input to a asymmetric structure so that all variations of connecting the inputs to the structure are represented, and (d) connecting the output leads of the asymmetric structures together so that the asymmetric structures balance one another and provide a combined structure that is symmetric overall.

In one aspect of the method, the logic gate is a current-mode-logic (CML) gate. Also in one aspect in step (d), the symmetric structure is an AND structure. In another aspect in step (d), the symmetric structure is a NAND structure. In a preferred application in step (b) there are two separate input voltage ranges applied to the gate, the voltage ranges defined as one higher voltage range and one lower voltage range.

In preferred aspects in step (c), an even division of the number of signal input leads connected to inputs on the symmetrical structure are operated at the higher voltage range, and wherein the remaining number of signal input leads connected to inputs on the symmetrical structure are operated at the lower voltage range. In all aspects in step (d), the output of the symmetrical structure is a weighted sum of the outputs of the asymmetrical structures of step (a).

Now, for the first time, a symmetrical transistor structure is provided within a circuit that equalizes latency within the circuit in terms of signal propagation from multiple inputs to output of the circuit.

BRIEF DESCRIPTION OF THE DRAWING FIGURES

DESCRIPTION OF THE PREFERRED EMBODIMENTS

As was previously described in the background section, equivalence in latency from any input to any output in a CML circuit is highly desired for many types of task performance circuits such as a phase detection circuit, for example. Accordingly, is an object of the present invention to provide a symmetrical transistor structure within a CML circuit that will guarantee equivalence in latency for signal propagation within the circuit.

Figure 1A:
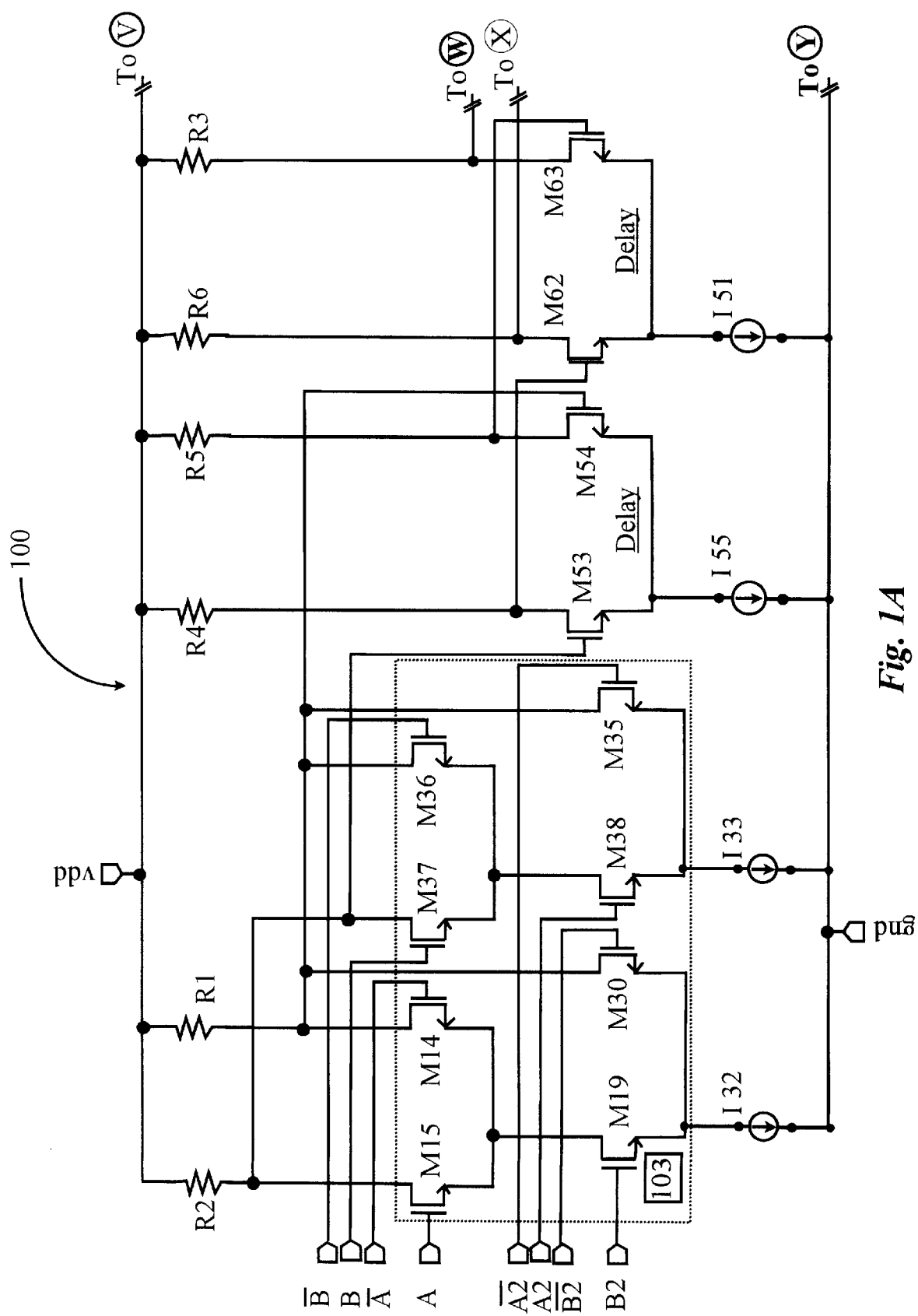
FIG. 1A is a simple schematic diagram of a portion of a symmetrical logic gate 100 according to an embodiment of the present invention.

FIG. 1A is a simple schematic diagram of a portion of a symmetrical logic gate 100 according to an embodiment of the present invention. CML logic gate 100 is, in this example, an AND gate. Signal inputs for gate 100 are represented at left in universal schematic symbols. These are signal inputs A and $\overline{A}$, inputs B and $\overline{B}$, inputs A2 and $\overline{A2}$, and inputs B2 and $\overline{B2}$. It is known in the art that the bar represents the opposite binary value from the value designated by an input without a bar. Hereinafter in this specification, the signal input pairs will simply be described as input pairs A, B, A2, and B2 with the understanding that the opposite value is represented by a bar over the symbols. It is also noted herein that input pairs A and A2 represent the same signal and that input pairs B and B2 represent the same signal.

Gate 100 operates at two voltage levels or stages. Signal pairs A and B operate at the higher voltage range while signal pairs A2 and B2 operate at the lower voltage range. It will be appreciated by one with skill in the art of CML logic gates that the voltage difference between the higher and lower voltage levels within a voltage range is considerably smaller than in other types of logic gates. Also, the voltage range between high and low for a single signal pair is also considerably smaller than in other types of logic gates wherein a definite on and off state exists in terms of transistor terminal state.

Figure 1B:
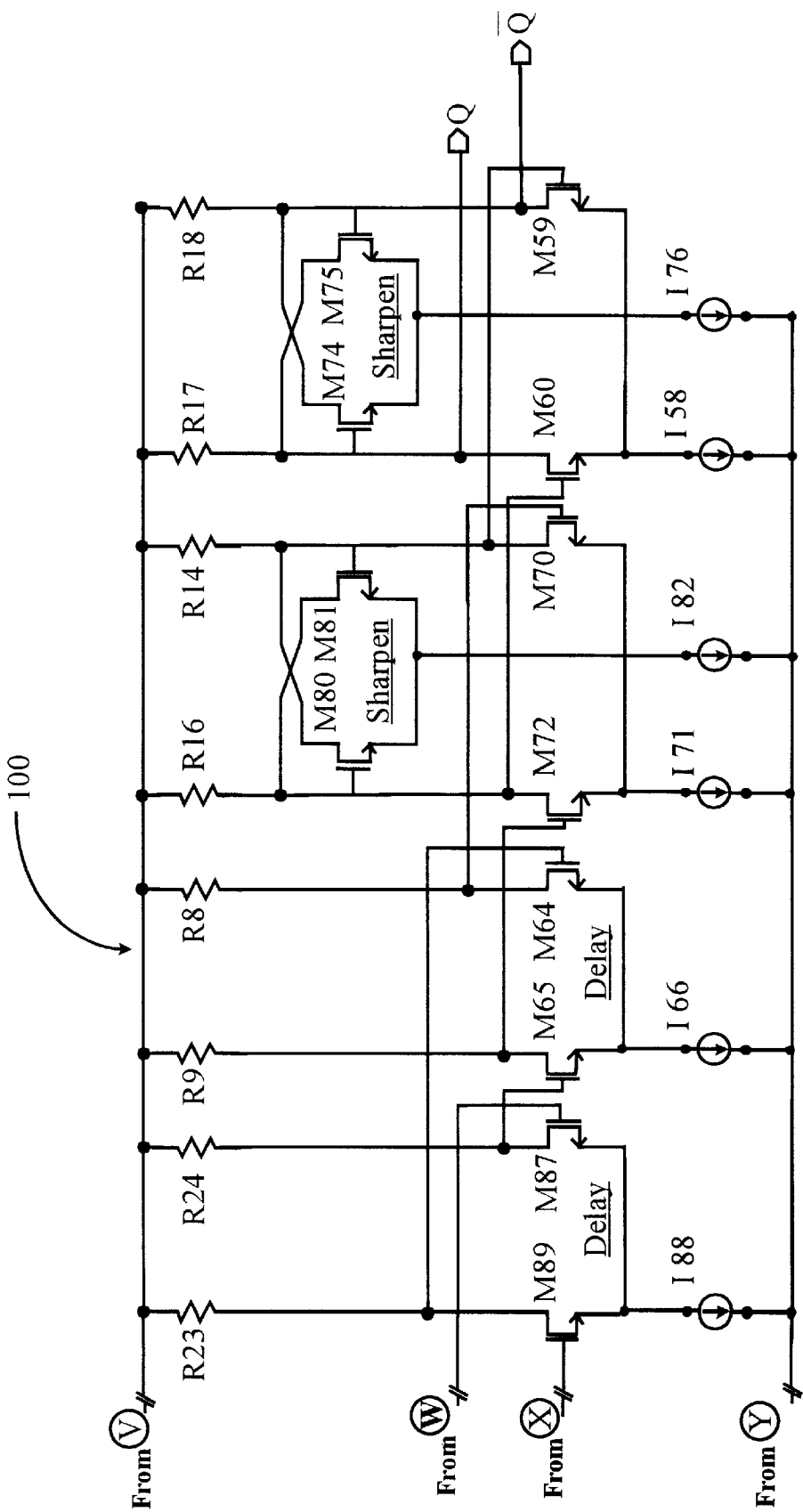
FIG. 1B is a simple schematic diagram of the remaining portion of the logic gate of FIG. 1A.

FIG. 1B is a simple schematic diagram of the remaining portion of the logic gate 100 of FIG. 1A. Referring now to FIG. 1B, signal outputs of gate 100 are illustrated as output Q and $\overline{Q}$. Referring now to both FIGS. 1A and 1B, general construction of gate 100 includes a voltage line represented by the schematic symbol vdd extending the entire length of schematic gate 100. Similarly, a ground line is illustrated along the entire length of schematic gate 100 and labeled with the schematic symbol gnd. Current sources I32, I33, I55 and I51 in FIG. 1A, I88, I66, I71, I82, I58, and I76 in FIG. 1B control the currents in each logic structure. In this example, each structure has a resistive load, these resistors are labeled R2, R1, R4, R5, R6, and R3 in FIG. 1A, and R23, R24, R9, R8, R16, R14, R17 and R18 in FIG. 1B.

Referring now back to FIG. 1A, a symmetrical construction is implemented in this example regarding the first eight transistors represented in gate 100, namely transistors M15, M14, M37, M36, M19, M30, M38, and M35. When any input signal voltage is high (1) a transistor is considered on and therefore allowing current to flow between its drain and source as part of a path from vdd to gnd. When an input signal voltage is low, a transistor is considered off breaking the current flow through that transistor.

The symmetrical transistor architecture described above is illustrated as enclosed in a dotted rectangle labeled with the element number 103. The symmetry represented in this architecture is achieved by taking 2 conventional AND structures and connecting their outputs together as described in the method above. In this way the asymmetry of a conventional AND structure is avoided.

Each signal input to gate 100 is connected to an input on each structure or transistor pair. For example, input pair A in the highest voltage range of CML gate 100 is connected to inputs of transistors M15 and M14 while input pair B in the highest voltage range of CML 100 is connected to inputs of transistors M37 and M36. Pairs A and B enjoy an equal latency from input to output because they are connected to the same input of their respective structures. It is noted herein however that in a prior art circuit, signal pairs A2 and B2 represented in the lower voltage range of gate 100 would have a greater latency than pairs A and B because of the necessity of traveling through additional transistors to reach the output. However, in this symmetrical structure the transistor output configuration of input pairs A, B and A2, B2 are constructed such that A and B are mirror images of each other and similarly A2 and B2 are mirror images thereby eliminating any un-equivalence in terms of latency of signal propagation from any input to structure 103 to the output of the structure.

The transistor structure within box 103 functions to perform the logical operation of an AND gate. Any one input signal into structure 103 enjoys an equal propagation through the structure compared with any other input into structure 103. The construction method for producing an equal signal-propagation architecture includes duplicating the asymmetric structure of the standard logic gate once for each possible combination of inputs and providing each input simultaneously on all available input ranges. Then each input to a asymmetric structure is connected such that all variations of connecting the inputs to the structure are represented. Finally, all of the output leads of the asymmetric structures are connected together so that the asymmetric structures balance one another and provide a combined structure (103) that is symmetric overall.

The weightings and delays are inherent in the asymmetrical structures before their outputs are connected. Providing each input simultaneously on all available input ranges and connecting each input to the asymmetrical structures so that all possible variations of input connection are represented ensures that all possible weightings and delays are applied to all inputs so that when the outputs of the asymmetric structures are summed by the overall-symmetric structure, the delay from each input to the output is determined by the same weighted sum.

An integrated and fixed delay structure is provided by an illustrated array of conventional delay buffers illustrated as transistor pairs M53, M54; M62, and M63 of FIG. 1A, and transistor pairs M89, M87; M65, and M64 in FIG. 1B. Referring now to FIG. 1B, signal edge sharpeners are provided for cleaning up the signal output. These cross-coupled structures are identified and labeled as transistor pairs M80, M81, and M74, M75.

Assuming, for example, that gate 100 is a phase detection circuit used in PLL synthesizing, then there would be no error in quantification of phase error. The accuracy of phase detection with no signal-propagation latency un-equivalencies is greatly improved and can be represented as a straight line on an X, Y line graph.

It will be apparent to one with skill in the art of CML logic that the method of the present invention may be expanded to include a wide variety of logic gates where latency un-equivalence in signal propagation poses a problem in task performance.

The method and apparatus of the present invention is not limited to the specific embodiments described and can be utilized in existing applications not described or in new applications made possible as a result of the invention. Therefore, the method and apparatus of the present invention should be afforded the broadest possible scope under examination. The spirit and scope of the present invention is limited only by the claims that follow.

What is claimed is:

1. A multilevel logic gate for processing digital data in a semiconductor application comprising:
   two or more signal inputs;
   an asymmetric standard logic gate structure duplicated once for each possible combination of inputs, each duplication having an output; and
   a symmetric structure connected to each input and to each asymmetric gate structure representing all variations of connecting the inputs to the structure;
   characterized in that outputs of the asymmetric structures are connected together so that the asymmetric structures balance one another and provide a combined structure that is symmetric overall, the output being a weighted sum of the outputs of the asymmetrical structures.

2. The multilevel logic gate of claim 1, wherein the gate is implemented in current-mode-logic (CML).

3. The multilevel logic gate of claim 1, wherein the symmetrical structure is an AND structure.

4. The multilevel logic gate of claim 1, wherein the symmetrical structure is a NAND structure.

5. The multilevel logic gate of claim 1, wherein there are two separate input voltage ranges applied to the gate, the voltage ranges defined as one higher voltage range and one lower voltage range.

6. The multilevel logic gate of claim 5, wherein an even division of the number of signal input leads connected to inputs on the symmetrical structure are operated at the higher voltage range, and wherein the remaining number of signal input leads connected to inputs on the symmetrical structure are operated at the lower voltage range.

7. A method for producing an equal signal-propagation latency from any input on multiple input, multilevel logic gate to any output on the gate comprising:
   (a) duplicating the asymmetric structure of the standard logic gate once for each possible combination of inputs;
   (b) providing each input simultaneously on all input ranges;
   (c) connecting each input to a asymmetric structure so that all variations of connecting the inputs to the structure are represented, and
   (d) connecting the output leads of the asymmetric structures together so that the asymmetric structures balance one another and provide a combined structure that is symmetric overall, the output being weighted sum of the outputs of the asymmetrical structures of step (a).

8. The method of claim 7 wherein in step (a), the logic gate is a current-mode-logic (CML) gate.

9. The method of claim 7 wherein in step (d), the symmetric structure is an AND structure.

10. The method of claim 7 wherein in step (d), the symmetric structure is a NAND structure.

11. The method of claim 7 wherein in step (b), there are two separate input voltage ranges applied to the gate, the voltage ranges defined as one higher voltage range and one lower voltage range.

12. The method of claim 11 wherein in step (c), an even division of the number of signal input leads connected to inputs on the symmetrical structure are operated at the higher voltage range, and wherein the remaining number of signal input leads connected to inputs on the symmetrical structure are operated at the lower voltage range.

* * * * *